United States Patent

Yvon (10) Patent No.: US 11,830,873 B2
(45) Date of Patent: Nov. 28, 2023

(54) ELECTRONIC CIRCUIT COMPRISING DIODES

(71) Applicant: STMICROELECTRONICS (TOURS) SAS, Tours (FR)

(72) Inventor: Arnaud Yvon, Saint-Cyr sur Loire (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 128 days.

(21) Appl. No.: 16/583,090

(22) Filed: Sep. 25, 2019

(65) Prior Publication Data

US 2020/0105749 A1    Apr. 2, 2020

(30) Foreign Application Priority Data

Sep. 27, 2018 (FR) ...................................... 1858874

(51) Int. Cl.
| | | |
|---|---|---|
| *H01L 27/08* | (2006.01) | |
| *H01L 21/8252* | (2006.01) | |
| *H01L 27/06* | (2006.01) | |
| *H01L 29/861* | (2006.01) | |
| *H01L 29/872* | (2006.01) | |

(52) U.S. Cl.
CPC ...... *H01L 27/0814* (2013.01); *H01L 21/8252* (2013.01); *H01L 27/0676* (2013.01); *H01L 29/8611* (2013.01); *H01L 29/872* (2013.01)

(58) Field of Classification Search
CPC ...... H01L 27/08; H01L 21/8252; H01L 27/06
USPC ........................................................ 257/76
See application file for complete search history.

(56) References Cited

U.S. PATENT DOCUMENTS

| | | | | |
|---|---|---|---|---|
| 5,181,087 A | * | 1/1993 | Usagawa | H01L 29/8128 257/E21.507 |
| 9,281,388 B2 | | 3/2016 | Briere | |
| 10,283,499 B2 | | 5/2019 | Baines et al. | |
| 2003/0068854 A1 | * | 4/2003 | Blanchard | H01L 29/0634 438/212 |
| 2003/0219952 A1 | * | 11/2003 | Fujimaki | H01L 21/82285 438/322 |
| 2008/0128914 A1 | * | 6/2008 | Morita | H01L 27/14683 257/773 |
| 2009/0166677 A1 | * | 7/2009 | Shibata | H01L 29/7783 257/192 |
| 2011/0260174 A1 | * | 10/2011 | Hebert | H01L 29/7786 257/77 |

(Continued)

FOREIGN PATENT DOCUMENTS

| | | | |
|---|---|---|---|
| JP | 4487481 | * | 6/2010 |
| JP | 2012-28409 A | | 2/2012 |
| JP | 2015-198175 A | | 11/2015 |

OTHER PUBLICATIONS

Du et al., "Design of high breakdown voltage GaN vertical HFETs with p-GaN buried buffer layers for power switching applications," *Superlattices and Microstructures* 83:251-260, 2015.

(Continued)

*Primary Examiner* — Sheng-Bai Zhu
(74) *Attorney, Agent, or Firm* — Seed IP Law Group LLP (57) ABSTRACT

The present description concerns an electronic device comprising a stack of a Schottky diode and of a bipolar diode, connected in parallel by a first electrode located in a first cavity and a second electrode located in a second cavity.

17 Claims, 7 Drawing Sheets

(56) References Cited

U.S. PATENT DOCUMENTS

| | | | |
|---|---|---|---|
| 2013/0002336 A1* | 1/2013 | Hatsukawa | H03K 17/74 |
| | | | 327/419 |
| 2013/0015499 A1* | 1/2013 | Briere | H01L 29/7787 |
| | | | 257/191 |
| 2014/0001489 A1* | 1/2014 | Yen | H01L 29/872 |
| | | | 257/77 |
| 2016/0118490 A1* | 4/2016 | Padmanabhan | H01L 27/0629 |
| | | | 257/195 |
| 2018/0374848 A1* | 12/2018 | Baines | H01L 29/872 |
| 2020/0343413 A1* | 10/2020 | Bono | H01L 33/44 |

OTHER PUBLICATIONS

Shibata et al., "1.7 kV/1.0 mΩcm$^2$ normally-off vertical GaN transistor on GaN substrate with regrown p-GaN/AlGaN/GaN semipolar gate structure," 2016 IEEE International Electron Devices Meeting (IEDM), San Francisco, CA, 2016, pp. 10.1.1-10.1.4.

\* cited by examiner

ELECTRONIC CIRCUIT COMPRISING DIODES

BACKGROUND

Technical Field

The present disclosure generally relates to electronic circuits and, more specifically, to electronic circuits comprising diodes.

Description of the Related Art

Schottky diodes are diodes formed of a metal/semiconductor junction. Such diodes have the advantage over so-called bipolar diodes of being fast and of having a relatively low forward voltage drop. However, they are not able to withstand overcharges as well as bipolar diodes.

BRIEF SUMMARY

Applicant has found that it is advantageous to connect in parallel a bipolar diode and a Schottky diode.

An embodiment provides an electronic device comprising a stack of a Schottky diode and of a bipolar diode, connected in parallel by a first electrode located in a first cavity and a second electrode located in a second cavity.

According to an embodiment, the stack comprises first, second, and third semiconductor layers.

According to an embodiment, the bipolar diode comprises the first semiconductor layer in contact with the second semiconductor layer, the second layer being of the conductivity type opposite to that of the first layer.

According to an embodiment, the first cavity reaches the first semiconductor layer and the second cavity reaches the second semiconductor layer.

According to an embodiment, the first and second semiconductor layers are made of gallium nitride.

According to an embodiment, the Schottky diode comprises the third semiconductor layer in contact with the first and second electrodes, the material of a portion of one of these electrodes being capable of forming the Schottky diode.

According to an embodiment, the third semiconductor layer is made of AlGaN.

According to an embodiment, one of the first and second electrodes is the cathode electrode of the Schottky diode and of the bipolar diode and the other one of the first and second electrodes is the anode electrode of the Schottky diode and of the bipolar diode.

Another embodiment provides a method of manufacturing an electronic device comprising a stack of a Schottky diode and of a bipolar diode, comprising a step of forming first and second cavities having first and second electrodes connecting in parallel the Schottky diode and the bipolar diode located therein.

According to an embodiment, the method comprises:
 forming first and second semiconductor layers of the bipolar diode and a third semiconductor layer of the Schottky diode;
  forming first and second cavities; and
  forming first and second electrodes in the cavities to connect the Schottky diode and the bipolar diode in parallel.

According to an embodiment, the first cavity reaches the first semiconductor layer and the second cavity reaches the second semiconductor layer.

According to an embodiment, the method comprises depositing an insulating layer on the walls and the bottom of the first and second cavities.

According to an embodiment, the method comprises, before the forming of the first and second cavities, forming first and second intermediate cavities reaching the lower surface of the third semiconductor layer, the rest of the first and second cavities being formed afterwards from the bottom of the first and second intermediate cavities.

According to an embodiment, the method comprises forming a first conductive layer on the walls and the bottom of each of the first and second intermediate cavities.

According to an embodiment, the method comprises removing the insulating layer from at least a portion of the bottom of the first and second cavities and from the first conductive layers.

According to an embodiment, the method comprises forming a second conductive layer in each of the first and second cavities, to connect, in the first cavity, the first semiconductor layer to the first conductive layer of the first intermediate cavity and, in the second cavity, the second semiconductor layer to the first conductive layer of the second intermediate cavity.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings, in which.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct connection between circuit elements, whereas the term "coupled" is used to designate a connection between circuit elements that may be direct, or may be via one or more intermediate elements. Unless indicated otherwise, when the term "coupled" is used, the connection can be implemented by a direct connection.

In the following description, when reference is made of qualifiers of absolute positions, such as terms "front", "back", "top", "bottom", "left-hand", "right-hand", etc., or relative positions, such as terms "above", "under", "upper", "lower", etc., or to qualifiers of orientation, such as terms "horizontal", "vertical", etc., reference is made, unless otherwise specified, to the orientation of the considered elements in the drawings.

The terms "approximately", "substantially", and "in the order of" are used herein to designate a tolerance of plus or minus 10%, preferably of plus or minus 5%, of the value in question.

Figure 1:
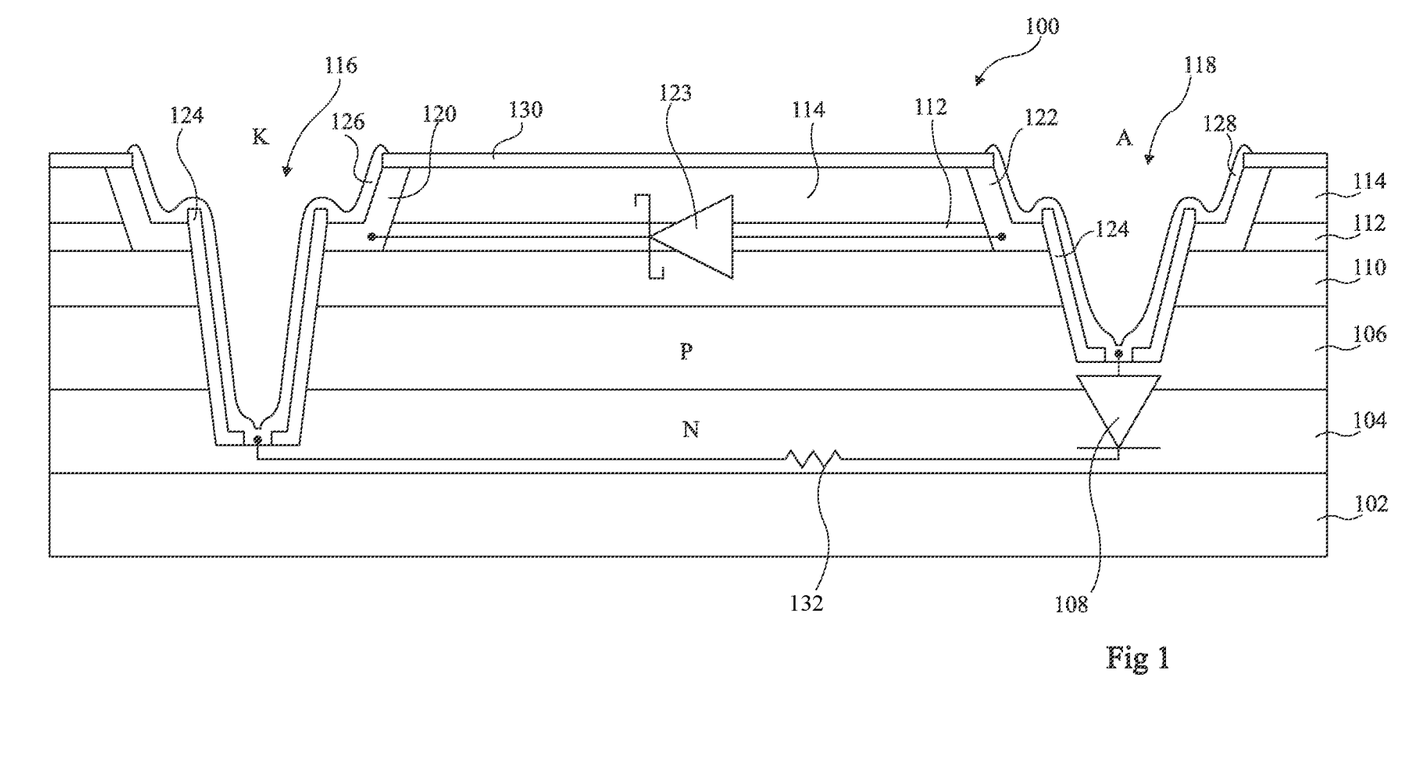
FIG. 1 schematically shows an embodiment of a Schottky diode and of a bipolar diode in parallel.

FIG. 1 schematically and partially shows an embodiment of a device 100 comprising a Schottky diode and a bipolar diode. FIG. 1 also partially shows an equivalent diagram of device 100.

Device 100 comprises a stack of semiconductor layers. The stack comprises a layer 102, for example, made of aluminum gallium nitride (AlGaN), located on a substrate, not shown. Layer 102 is covered with an N-type gallium nitride layer 104 and with a P-type gallium nitride layer 106. Layer 106 is for example doped with magnesium. Layer 108 is for example doped with silicon or germanium. Layers 104 and 106 form a PN junction which forms a bipolar diode 108. More specifically, layer 104 forms the cathode of bipolar diode 108 and layer 106 forms the anode of diode 108. Layer 106 is covered with a layer 110, for example, made of gallium nitride. Layer 110 is covered with a layer 112, for example, made of AlGaN and with a passivation layer 114, for example, made of silicon nitride or of gallium nitride.

Device 100 further comprises cavities 116 and 118 extending in the stack. Cavities 116 and 118 comprise an upper portion and a lower portion. The upper portion of each cavity 116 or 118 stops substantially at the level of the lower surface of layer 112. The lower portion of cavity 116 extends through layers 110 and 106 and stops in layer 104. The lower portion of cavity 118 extends through layer 110 and stops in layer 106. The opening of the upper portion for example has dimensions greater than the dimensions of the opening of the lower portion. The walls and the bottom of the upper portion of cavities 116 and 118 are covered with a conductive layer 120 or 122. The layer 120 or 122 of each cavity 116 or 118 is in contact with semiconductor layer 112. The material of layer 122 of cavity 118 is a metal selected to form a Schottky diode 123 between layer 122 and layer 112. Layer 122 thus forms the anode of Schottky diode 123. Layer 120 is an ohmic electrode in contact with layer 112 and forming the cathode of Schottky diode 123. Cavities 116 and 118 cross layer 112, and thus Schottky diode 123.

The walls of the lower portions of cavities 116 and 118 are covered with an insulating layer 124. The bottom of the lower portions of cavities 116 and 118 are partially covered with layer 124. A portion of the bottom of the lower portion of each cavity 116 or 118 is thus exposed. A conductive layer 126 covers the walls and the bottom of cavity 116 and a conductive layer 128 covers the walls and the bottom of cavity 118. Layer 126 thus forms an electric connection between layer 104, through the bottom of cavity 116 and electrode 120. Conductive layer 128 forms an electric connection between layer 106, through the bottom of cavity 118, and electrode 122. Thus, the anodes (A) of diodes 108 and 123 are connected together at the level of cavity 118 and the cathodes (K) of diodes 108 and 123 are connected together at the level of cavity 116.

Device 100 further comprises an insulating layer 130 covering layer 114 around cavities 116 and 118 as well as the portion of conductive layers 120 and 122 located in the same plane as the upper surface of layer 114.

Cavities 116a and 118a are for example separated by a distance in the range from approximately 10 μm to approximately 25 μm. The distance between the bottom of cavity 116 and the bottom of cavity 118 may cause the presence of a resistor 132 in series with diode 108.

Figure 2:
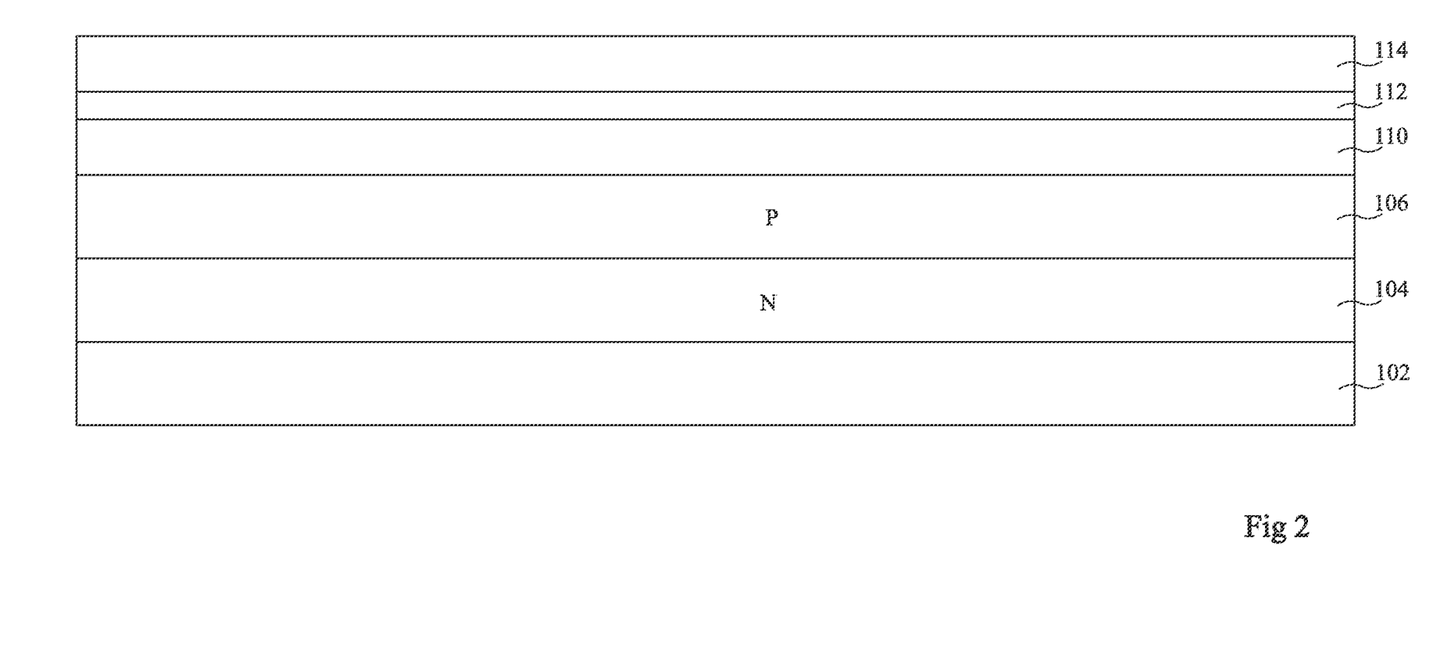
FIG. 2 schematically shows the result of a step of manufacturing of the embodiment of FIG. 1.

FIG. 2 schematically shows the result of a step of manufacturing of the embodiment of FIG. 1. During this step, the stack of layers is formed on the substrate, not shown. More specifically, the following are successively formed:

layer 102, for example, made of AlGaN, on the substrate, not shown;

layer 104, made of gallium nitride, on layer 102;

layer 106, made of gallium nitride, on layer 104, of type P, formed by epitaxy and having a thickness in the range from approximately 50 to approximately 400 nm, preferably, approximately 200 nm;

layer 110, for example, made of gallium nitride, having a thickness in the range from approximately 50 to approximately 400 nm, preferably approximately 100 nm;

layer 112, for example, made of AlGaN, having a thickness in the range from 10 to 30 nm, preferably approximately 24 nm;

passivation layer 114, for example, made of silicon nitride or of gallium nitride.

Figure 3:
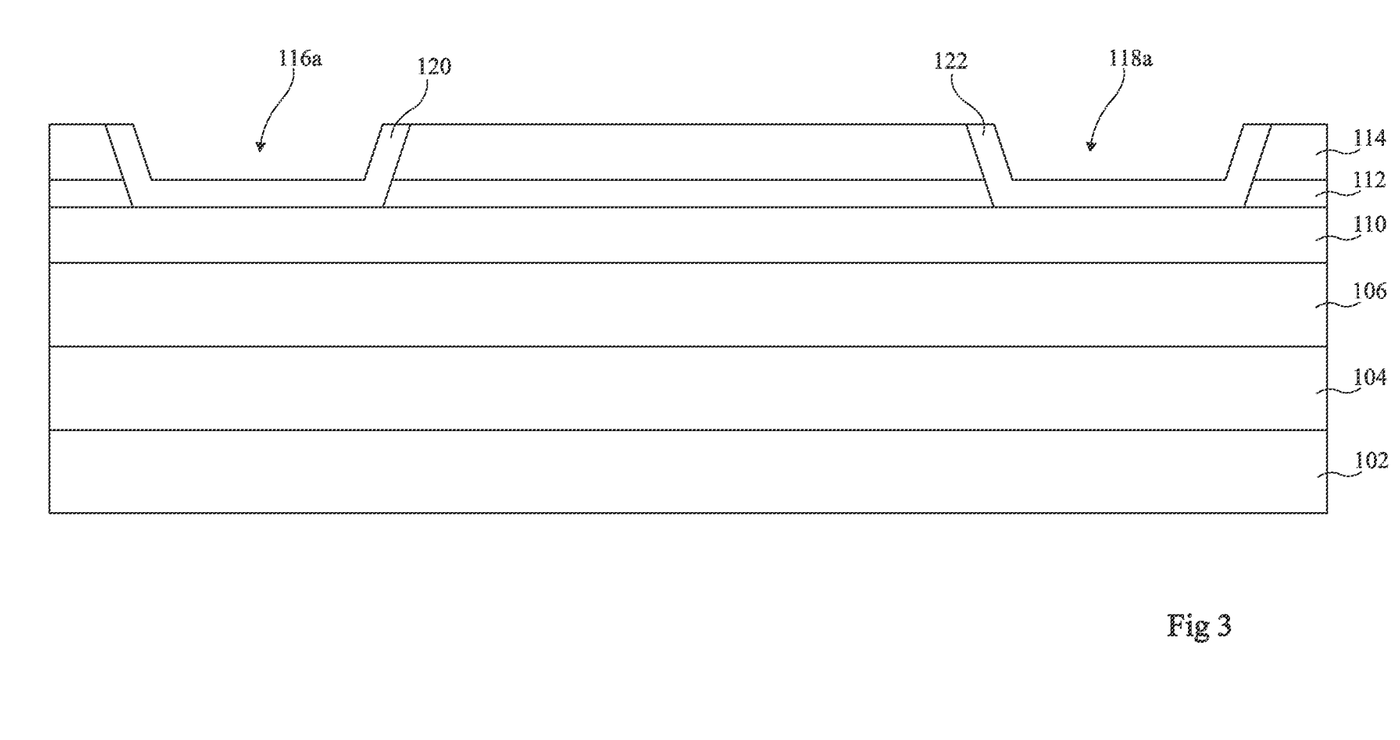
FIG. 3 schematically shows the result of another step of manufacturing of the embodiment of FIG. 1.

FIG. 3 shows the result of another step of manufacturing of the embodiment of FIG. 1. During this step, cavities 116a and 118a are formed in layers 112 and 114 to reach the lower surface of layer 112, and thus the upper surface of layer 110.

Cavity 116a is located at the location where cavity 116 is desired to be formed and will form the upper portion of cavity 116. Conductive layer 120 is deposited on the walls and on the bottom of cavities 116a. Conductive layer 120 is in contact with layer 112 at the level of the walls of cavity 116.

Cavity 118a is located at the location where cavity 118 is desired to be formed and will form the upper portion of cavity 118. Conductive layer 122 is deposited on the walls and on the bottom of cavities 118a. Conductive layer 122 is in contact with layer 112 at the level of the walls of cavity 118.

Figure 4:
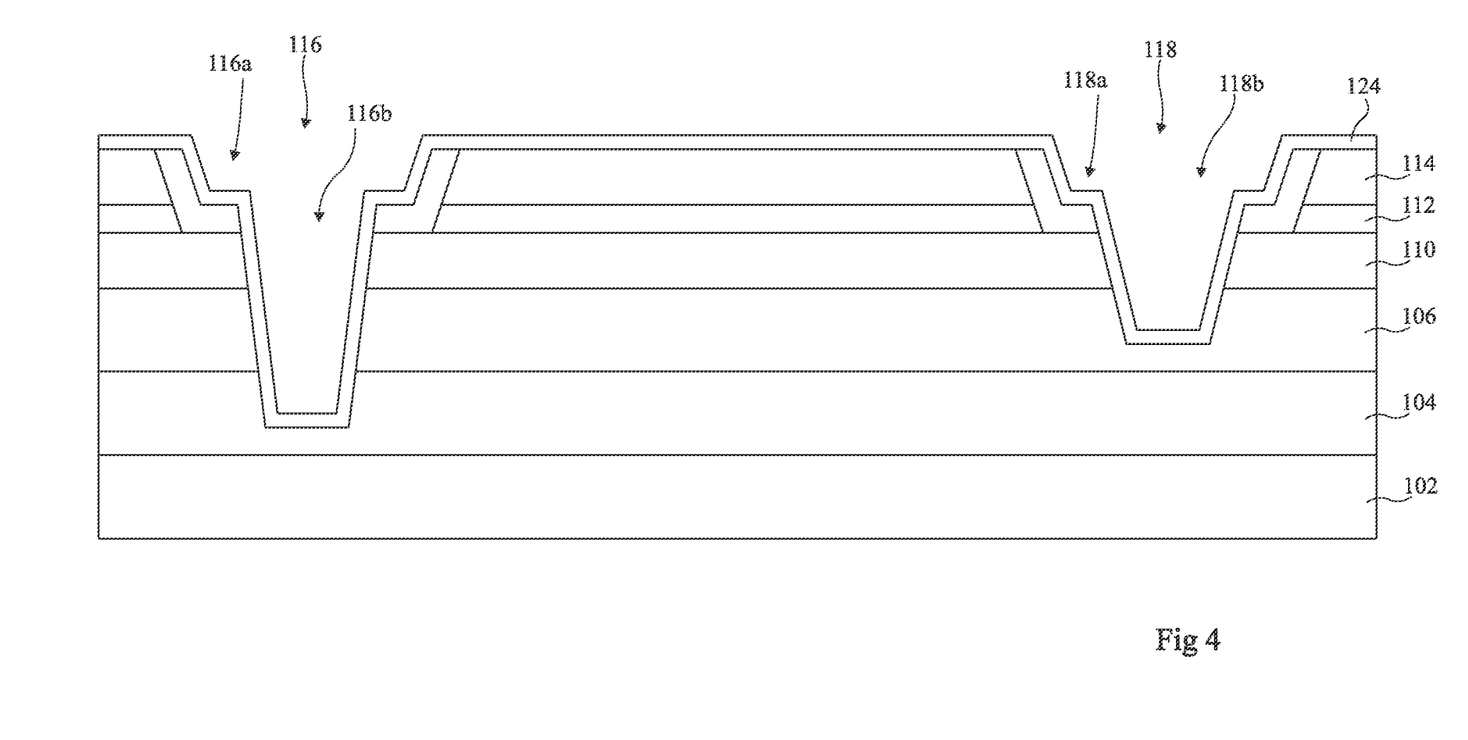
FIG. 4 schematically shows the result of another step of manufacturing of the embodiment of FIG. 1.

FIG. 4 shows the result of another step of manufacturing of the embodiment of FIG. 1. During this step, a cavity 116b is formed from the bottom of cavity 116a and a cavity 118b is formed from the bottom of cavity 118a. The dimensions of the openings of cavities 116b and 118b are smaller than the dimensions of the bottom of cavities 116b and 118b. Cavities 116a and 116b form together cavity 116 and cavities 118a and 118b form together cavity 118.

Cavities 116b and 118b are for example formed in a plurality of etch steps. During a first step, cavity 116b is for example etched to reach layer 104 and, during a second step, cavity 118b is for example etched to reach layer 106. As a variation, cavities 116b and 118b are for example both etched to reach layer 106 during a first etch step, and cavity 116b is deepened during a second etch step.

Insulating layer 124 covers the device and particularly the bottom and the walls of cavities 116a, 118a, 118b, and 116b.

Figure 5:
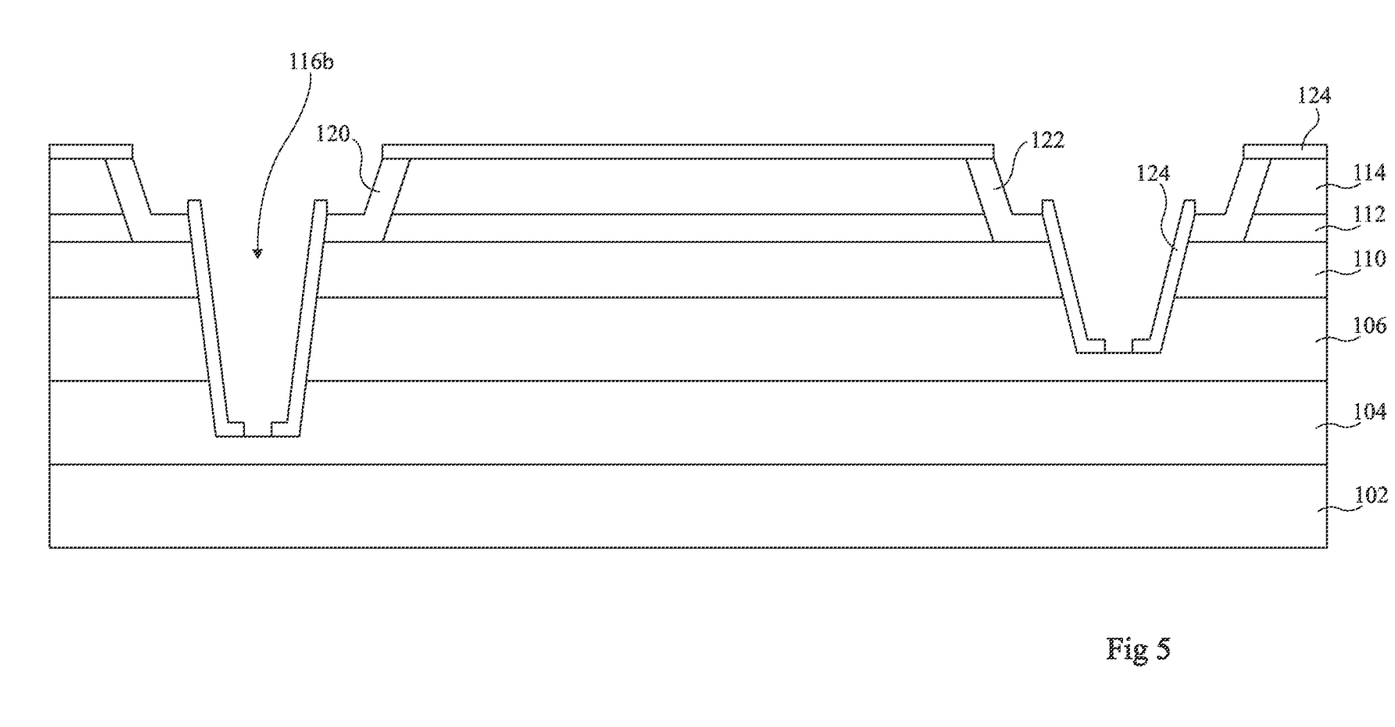
FIG. 5 schematically shows the result of another step of manufacturing of the embodiment of FIG. 1.

FIG. 5 shows the result of another step of manufacturing of the embodiment of FIG. 1. During this step, insulating layer 124 is partially etched. More particularly, layer 124 is at least partially etched in the bottom of cavities 116b and 118b and is partially etched above conductive layers 120 and 122. Thus, layer 104 and layer 120 are accessible from cavity 116. Similarly, layer 106 and layer 122 are accessible from cavity 118.

This step may possibly comprise the doping of layer 104 from the bottom of cavity 116b to allow a better connection with an electrode.

Figure 6:
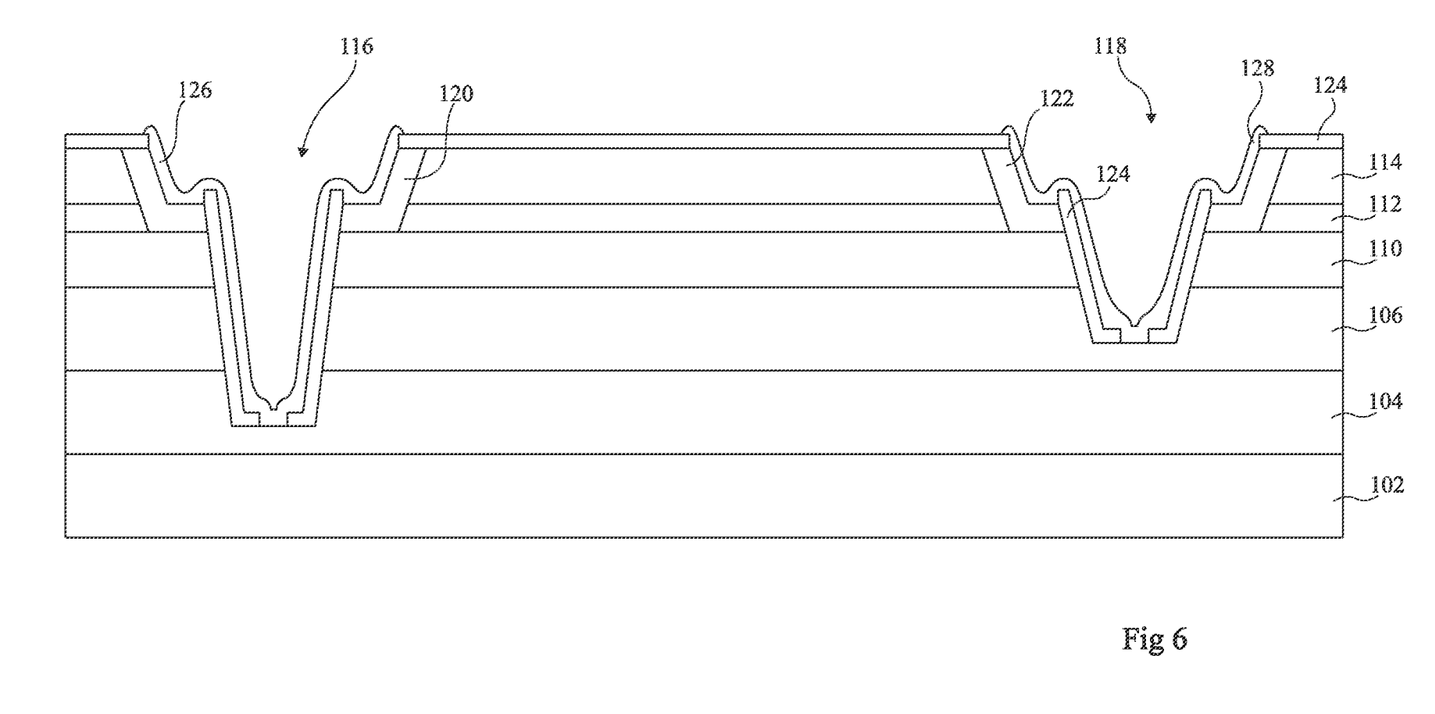
FIG. 6 schematically shows the result of another step of manufacturing of the embodiment of FIG. 1.

FIG. 6 shows the result of another step of manufacturing of the embodiment of FIG. 1. During this step, conductive layer 126 is formed, for example, conformally, on the walls and the bottom of cavities 116a and 116b. Layer 104 and layer 120 are thus electrically connected. Similarly, conductive layer 128 is formed, for example conformally, on the walls and the bottom of cavities 118a and 118b. Layer 106 and layer 122 are thus electrically connected.

Conductive layers 126 and 128 are for example formed by etching of a same conductive layer covering, for example conformally, the device.

Figure 7:
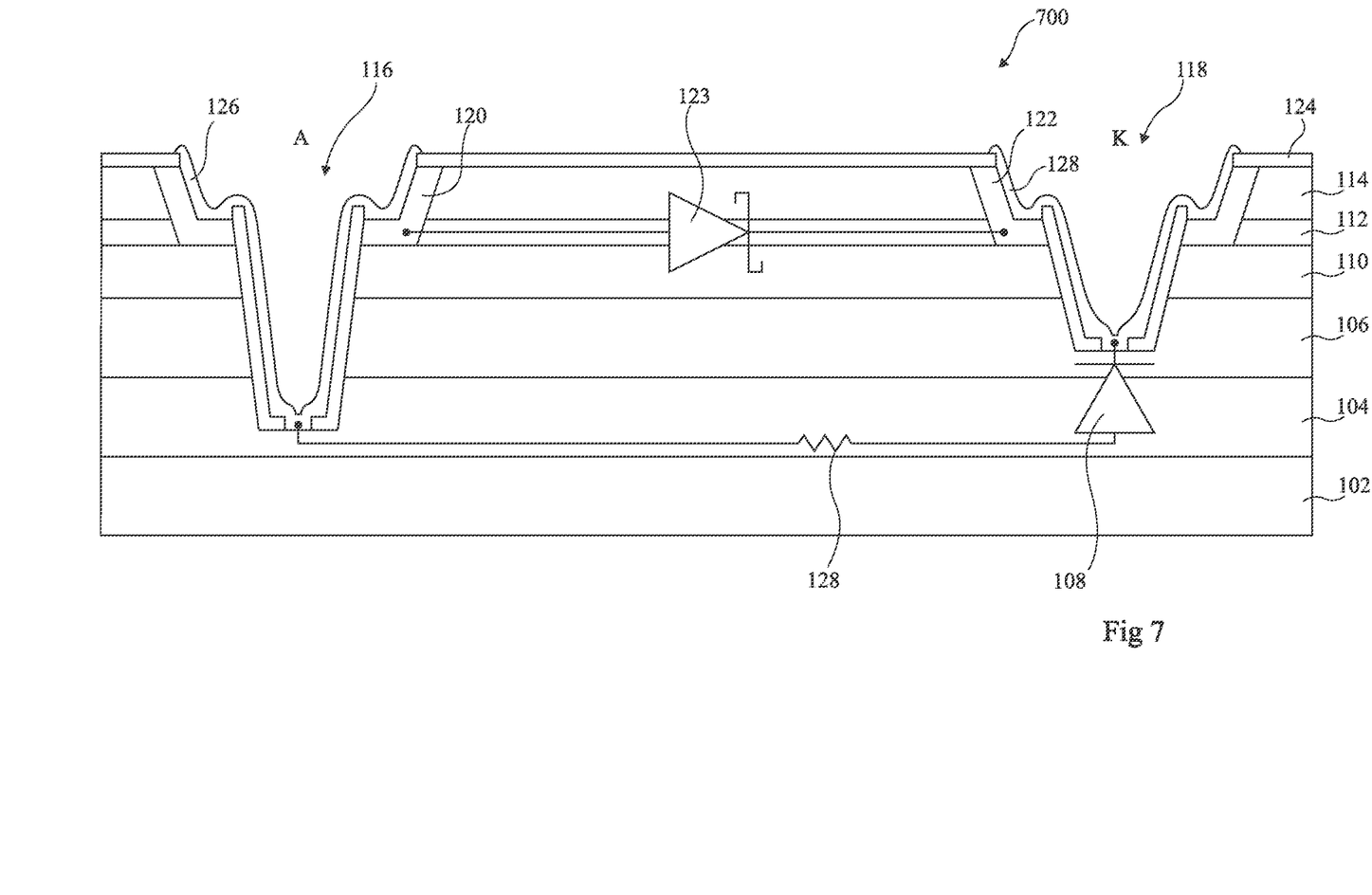
FIG. 7 schematically shows another embodiment of a Schottky diode and a bipolar diode in parallel.

FIG. 7 schematically shows another embodiment of a device 700 comprising a Schottky diode and a bipolar diode.

Device 700 is similar to device 100 of FIG. 1 and comprises same elements located similarly.

In device 700, layer 106 is located between layer 102 and layer 104, unlike device 100 of FIG. 1 where layer 104 is located between layer 102 and layer 106. Thus, conductive layer 126 of cavity 116 is connected to the anode of diode 108 and not to the cathode. Similarly, the conductive layer 128 of cavity 118 is connected to the cathode of diode 108 and not to the anode.

Further, in the embodiment of FIG. 7, conductive layer 120 forms a Schottky contact with layer 112, and conductive layer 122 forms an ohmic contact with layer 112. Thus, conductive layer 120 forms the anode of diode 123 and conductive layer 122 forms the cathode.

Thus, the anodes (A) of diodes 108 and 123 are connected together at the level of cavity 116 and the cathodes (K) of diodes 108 and 123 are connected together at the level of cavity 118.

The other elements of device 700 are similar to those of device 100 and are thus not detailed again.

Various embodiments and variations have been described. It should be clear to those skilled in the art that certain characteristics of these various embodiments and variations may be combined, and other variations will occur to those skilled in the art.

Finally, the practical implementation of the described embodiments and variations is within the abilities of those skilled in the art based on the functional indications given hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
  a substrate having a first surface, the substrate including:
    a first gallium nitride layer;
    a second gallium nitride layer on the first gallium nitride layer;
    a third gallium nitride layer on the second gallium nitride layer; and
    a passivation layer on the third gallium nitride layer;
  a first cavity in the first surface and extending through the second and third gallium nitride layers and into the first gallium nitride layer, the first cavity including a first dimension in a first direction at the passivation layer, a second dimension in the first direction at the second gallium nitride layer, and a third dimension in the first direction at the first gallium nitride layer, the first dimension being greater than the third dimension;
  a second cavity in the first surface and extending through the third gallium nitride layer and into the second gallium nitride layer, the second cavity including a fourth dimension in the first direction at the passivation layer, a fifth dimension in the first direction at the third gallium nitride layer, and a sixth dimension in the first direction at the second gallium nitride layer, the fourth dimension being greater than the sixth dimension;
  a first insulating layer completely within the first cavity and in contact with walls of the first gallium nitride layer, walls of the second gallium nitride layer, and walls of the third gallium nitride layer;
  a second insulating layer completely within the second cavity and in contact with walls of the second gallium nitride layer and walls of the third gallium nitride layer;
  a first conductive layer completely within the first cavity, the first conductive layer in contact with walls of the passivation layer, and the first conductive layer in contact with the first insulating layer between the third gallium nitride layer and the first surface;
  a second conductive layer in the first cavity, the second conductive layer in contact with the first conductive layer and the first insulating layer, the second conductive layer extending from the passivation layer to the first gallium nitride layer in the first cavity;
  a third conductive layer in completely within the second cavity, the third conductive layer in contact with walls of the passivation layer, and the third conductive layer in contact with the second insulating layer between the third gallium nitride layer and the first surface;
  a fourth conductive layer in the second cavity, the fourth conductive layer in contact with the third conductive layer and the second insulating layer extending from the passivation layer to the second gallium nitride layer;
  a first step area and a second step area positioned at an interface of the first insulating layer and the first conductive layer, the first and second step areas being between the third gallium nitride layer and the first surface;
  a third step area and a fourth step area positioned at an interface of the second insulating layer and the third conductive layer, the third and fourth step areas being between the third gallium nitride layer and the first surface;
  a Schottky diode coupled between the first cavity and the second cavity; and
  a bipolar diode coupled in parallel with the Schottky diode, the bipolar diode coupled between the first cavity and the second cavity.

2. The device of claim 1, comprising a fourth gallium nitride layer on the third gallium nitride layer.

3. The device of claim 1, wherein the third gallium nitride layer is aluminum gallium nitride.

4. The device of claim 1, wherein the first conductive layer is a cathode electrode of the Schottky diode, the second conductive layer is a cathode electrode of the bipolar diode, the third conductive layer is an anode electrode of the Schottky diode, and the fourth conductive layer is an anode electrode of the bipolar diode.

5. The device of claim 1, comprising a third insulating layer on the passivation layer, the first and second cavity being through the third insulating layer.

6. The device of claim 2, wherein the second gallium nitride layer is thicker than the third gallium nitride layer.

7. The device of claim 6, wherein the fourth gallium nitride layer is thinner than the third gallium nitride layer.

8. A method, comprising:
forming a first portion of a first cavity extending from a first surface of a passivation layer through the passivation layer and through a first conductive layer;
forming a first step area at a first side of the first cavity and a second step area at a second side opposite the first side of the first cavity by forming a second portion of the first cavity extending from the first conductive layer through a second conductive layer, through a third conductive layer, and into a fourth conductive layer, the third and fourth conductive layers being gallium nitride, the first step area and the second step area being spaced apart by a first dimension;
forming a fifth conductive layer completely within the first cavity from the first surface to the first and second steps, the fifth conductive layer being in contact with the passivation layer and on the first conductive layer;
forming a first insulating layer on the second, third, and fourth conductive layers completely within the first cavity, a second dimension between sides of the first insulating layer adjacent to the fourth conductive layer being less than the first dimension;
forming an opening in the first insulating layer in the fourth conductive layer;
forming a sixth conductive layer in the first cavity, the sixth conductive layer being in contact with the fifth conductive layer and on the first insulating layer and in the opening through the first insulating layer;
forming a second cavity that is spaced apart from the first cavity that extends from the first surface through the passivation layer, through the first conductive layer, through the second conductive layer, and into the third conductive layer;
forming a seventh conductive layer completely within the second cavity from the first surface into the first conductive layer;
forming a second insulating layer completely within the second cavity, the second insulating layer extending from the first conductive layer to the third conductive layer;
forming an eighth conductive layer in the second cavity, the eighth conductive layer being in contact with the seventh conductive layer and the second insulating layer;
forming a Schottky diode that is coupled between the fifth conductive layer and the seventh conductive layer; and
forming a bipolar diode coupled in parallel to the Schottky diode.

9. The method of claim 8 wherein the first conductive layer is gallium nitride.

10. The method of claim 9 wherein the second conductive layer is gallium nitride.

11. An electronic device comprising:
a semiconductor body having a first surface and including:
a first conductive layer of gallium nitride;
a second conductive layer of gallium nitride on the first conductive layer;
a third conductive layer on the second conductive layer;
a fourth conductive layer on the third conductive layer; and
a first insulating layer on the fourth conductive layer;
a first cavity from the first surface ending in the first conductive layer, the first cavity extending through the first insulating layer and through the second, third, and fourth conductive layers;
a second cavity spaced apart from the first cavity, the second cavity extending through the first insulating layer, through the third and fourth conductive layers, and ending in the second conductive layer;
a fifth conductive layer completely within the first cavity and completely within the second cavity, the fifth conductive layer extending from the first surface to a second surface that is between the third and fourth conductive layers in both the first and second cavities, the fifth conductive layer having a first side spaced from a second side by a first dimension in a first direction in the first cavity;
a sixth conductive layer in the first cavity and in the second cavity and in contact with the fifth conductive layer, the sixth conductive layer overlapping the fifth conductive layer in the first cavity and in the second cavity, the sixth conductive layer extending from the first surface to the first conductive layer in the first cavity and from the first surface to the second conductive layer in the second cavity, the sixth conductive layer having a first side that is spaced from a second side by a second dimension in the first direction in the first cavity, the second dimension is less than the first dimension;
a first step area and a second step area opposite the first step area within the first cavity, the first step area and the second step area being between the third conductive layer and the first surface;
a second insulating layer in the first cavity and including a first opening, the sixth conductive layer being in the first opening;
a third insulating layer in the second cavity and including a second opening, the sixth conductive layer being in the second opening.

12. The device of claim 11, wherein a bipolar diode is coupled between the sixth conducive layer in the first opening to the sixth conductive layer in the second opening.

13. The device of claim 12, wherein a Schottky diode is coupled between the fifth conductive layer in the first cavity and the fifth conductive layer in the second cavity.

14. The device of claim 13, wherein the third conductive layer is gallium nitride.

15. The device of claim 14, wherein the fourth conductive layer is gallium nitride.

16. The device of claim 15, wherein the second insulating layer covers the first, second, third, and fourth conductive layers.

17. The device of claim 16, wherein the third insulating layer covers the second, third, and fourth conductive layers.

* * * * *